July 31, 1962 A. E. BRENNEMANN 3,047,743

SUPERCONDUCTIVE CIRCUIT ELEMENT EXHIBITING MULTI-STATE CHARACTERISTICS

Filed Sept. 18, 1959 3 Sheets-Sheet 1

INVENTOR
ANDREW E. BRENNEMANN
BY Frederick J. Smyth
ATTORNEY

United States Patent Office 3,047,743

Patented July 31, 1962

3,047,743

SUPERCONDUCTIVE CIRCUIT ELEMENT EXHIBITING MULTI-STATE CHARACTERISTICS

Andrew E. Brennemann, Poughkeepsie, N.Y., assignor to International Business Machines Corporation, New York, N.Y., a corporation of New York Filed Sept. 18, 1959, Ser. No. 840,824

12 Claims. (Cl. 307—88.5)

This invention relates to superconductive circuits and more particularly to a novel cryotron type circuit having a plurality of resistance values, and is a continuation in part of application Serial No. 809,816, filed April 29, 1959 on behalf of Andrew E. Brennemann, and now abandoned.

Recently, a variety of circuits and systems have been developed utilizing elements fabricated of superconductive materials for performing functions similar to those performed by electronic and magnetic elements. Although these superconductive circuits are generally operated in the vicinity of absolute zero, this possible disadvantage is more than offset by their small physical size, rapid response, and low power consumption. Usually, superconductive circuits are operated at a fixed temperature at which the switchable elements, or gate conductors therein, normally exhibit superconductivity; that is zero resistance to the flow of electrical current. Application of a magnetic field of predetermined magnitude to these gate conductors, however, is effective to destroy the phenomenon of superconductivity and a resistance to the flow of electrical current is then exhibited which is a function of the operating temperature and the particular superconductive material.

In general, the required magnetic field is generated by means of current flow thorugh control conductors arranged in magnetic field applying relationship with the gate conductors. In order to reduce the power loss by current flow through the control conductors, it is preferred to fabricate these conductors from a "hard" superconductive material, that is one that remains superconducting in the presence of the value of magnetic field that destroys a superconductivity in the gate conductors, so that the control conductors exhibit zero electrical resistance at all times.

A more detailed discussion of superconductive circuits is contained in an article by D. A. Buck entitled, "The Cryotron—A Superconductive Computer Component," published in the Proceedings of the IRE, vol. 44, No. 4, April 1956, pages 482–493.

Current flow through the gate conductors additionally generates a magnetic field which, if it exceeds a predetermined value, can also destroy the superconductivity of the gate conductors. This value of current will be defined as the critical current of the gate conductor and is the limiting value of current which may be conducted by a gate without destroying superconductivity therein.

For certain geometries, it has been found that the resultant magnetic field applied to the gate conductor is relatively independent of the directions of current flow through the gate and control conductors and that the effective field applied to the gate is approximately the vector sum of the fields generated by current flow through both the gate and associated control conductors. It has also been found that the predetermined value of magnetic field or critical field, required to destroy superconductivity is inversely proportional to the operating temperature. For this reason, the value of critical current is also an inverse function of the temperature of the superconductive material.

When a portion of a normally superconducting gate, which is conducting a current having a magnitude in the vicinity of the value of critical current, is caused to become resistive, the entire gate, in general, will become resistive. This results from the fact that current flow through the resistive portion of the gate produces an $I^2R$ heating of adjacent segments which can reduce the value of critical current therein below the value of current being conducted by the gate. Under these conditions, therefore, the gate is capable of exhibiting only two values of resistance; either zero in the superconducting state, or a finite value when in the normal resistance state.

What has been discovered is a novel cryotron type circuit which can exhibit a plurality of resistance values depending on the number of independent sections of the gate which are caused to become resistive. Additionally, each section of the gate conductor may be independently controlled to exhibit either zero resistance or a finite value of resistance. According to the principles of the invention, the gate conductor consists of a plurality of operating sections separated by additional isolating sections having a greater width than the operating sections. In this manner, each of the isolating sections has a higher value of critical current than the operating sections. Thus, when an operating section is caused to become resistive, the heating thereof does not lower the value of critical current of the isolating sections below the value of current conducted by the entire gate conductor. Additionally, because the isolating sections remain superconducting, heat from a first resistive operating section is not conducted to a second operating section to thereby render it also resistive, because of the low thermal conductivity of the superconducting isolating section.

Although the invention will be illustrated in the drawings as conventional wire-wound cryotrons as an aid in understanding the operation of the circuits only, the cryotron of the invention is particularly adapted for use in planar cryotrons of the type disclosed in copending application Serial No. 625,512, filed November 30, 1956 on behalf of Richard L. Garwin and assigned to the assignee of this invention. This results from the fact that the gate conductor of the cryotron having multiple resistance characteristics may be fabricated in a single operation without employing soldering, welding, or other operations to interconnect the various sections.

It is an object of the invention to provide an improved cryotron type circuit.

Still another object of the invention is to provide a planar gate conductor having operating sections and isolating sections wherein the state of any operating section, either superconducting or resistive, does not influence the state of any other operating section.

Another object of the invention is to provide a cryotron type circuit having multiple resistance states.

Yet another object of the invention is to provide a cryotron type circuit useful as an output device in superconductive circuits.

A further object of the invention is to provide a cryotron type circuit useful as an analog to digital converter.

Still another object of the invention is to provide a cryotron type circuit having multiple resistance states wherein each resistance value may be accurately controlled.

A still further object of the invention is to provide a cryotron type device useful as a squarer.

The foregoing and other objects, features and advantages of the invention will be apparent from the following more particular description of preferred embodiments of the invention, as illustrated in the accompanying drawings.

Figure 1:
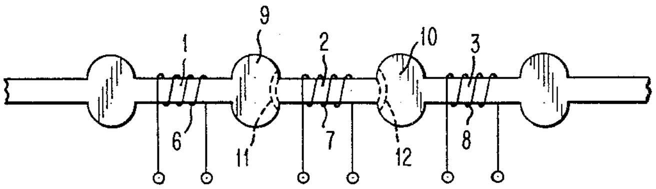
FIG. 1 is a diagrammatical section of a portion of the cryotron of the invention.

Referring now to the drawings, FIG. 1 shows a portion of a cryotron type circuit element according to the invention. The gate conductor as illustrated includes three operating sections 1, 2 and 3, the resistance of which is controlled by control conductors 6, 7 and 8, respectively. As shown in FIG. 1, each of the operating sections has the same width, as well as cross-sectional area, to thereby have the same value of critical current. However, as will be described hereinafter, each operating section may have a different value of critical current as required by the application wherein the cryotron of the invention is employed. A pair of isolating sections 9 and 10 alternate with the operating sections 6, 7 and 8, to provide decoupling between the operating sections. This decoupling ensures that the state of any operating section, either superconducting or normal, does not influence the state of any other operating section. Consider, by way of example, the cryotron operating at a temperature such that the gate conductor is superconducting, and further that the gate conductor is conducting a current, I, having a magnitude less than the critical current value of each of the operating sections. This value of current is not sufficient of and by itself to destroy superconductivity in any of the operating sections. Additionally, because the isolating sections have a width greater than that of the operating sections, as shown in FIG. 1, they have a larger value of critical current and also remain superconducting when current I flows therethrough. If now control conductor 7 is energized with a current of sufficient magnitude, operating section 2 becomes resistive. Power is then dissipated in section 2 in the form of heat due to the current I flowing through the resistive section. This local heating causes the temperature of section 2 to increase to a temperature $T+\Delta T$, where T is the temperature at which the superconductive circuit is operated and $\Delta T$ is the amount of heat produced by current I. This increased temperature extends into the isolating sections 9 and 10 as shown by zones 11 and 12, respectively, in FIG. 1. These zones of increased temperature have a lower value of critical current than the remaining regions of sections 9 and 10. However, this reduced critical current value remains substantially greater than the magnitude of current I, by proper design of sections 9 and 10, so that superconductivity is not destroyed throughout sections 9 and 10. Additionally, because of the low thermal conductance of the superconducting sections 9 and 10, the increased temperature $T+\Delta T$ is not propagated to either of the operating sections 1 or 3 to lower the value of critical current therein. In this manner, individual sections of the cryotron can be selectively driven resistive, without influencing the state of other operating sections of the gate conductor of the cryotron.

Although the novel cryotron type device of the invention may be employed in many superconductive circuits, only a few embodiments will be described herein; it then being apparent to those skilled in the art, that the novel cryotron of the invention is adaptable to a wide variety of circuits.

Figure 2:
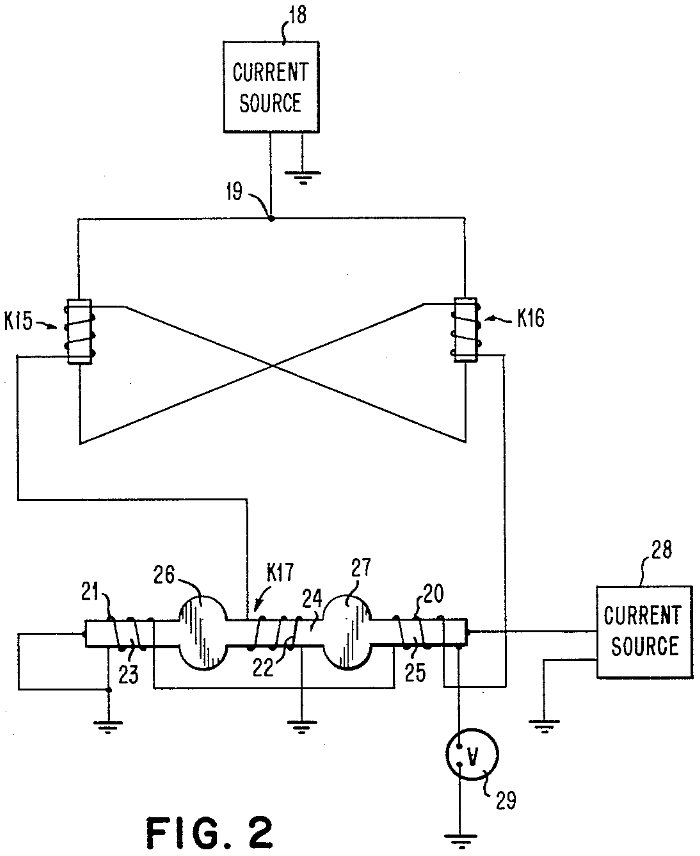
FIG. 2 is a schematic diagram of the cryotron of the invention employed as an output device in a superconductive circuit.

Referring now to FIG. 2, there is shown a superconductive flip-flop circuit comprising a pair of cross-connected cryotron type devices K15 and K16, wherein a novel cryotron of the invention, K17, is employed as an output device to indicate the state of the flip-flop. Current from a source 18 is fed to a junction 19 and thence to ground through one of a pair of parallel paths. A first path includes the gate conductor of K15, the control conductor of K16, and first and second control conductors, 20 and 21, of K17. A second path includes the gate conductor of K16, the control conductor of K15, and a third control conductor, 22 of K17. The control conductors 21, 22 and 20 are each effective to destroy superconductivity in the corresponding operating sections 23, 24 and 25 of the gate of K17, when energized by current from source 18. Thus, when current from source 18 flows in the second path, section 24 of the gate conductor of K17 is rendered resistive, and by means of isolating sections 26 and 27, this resistive section does not influence the superconducting sections 23 and 25 as hereinbefore explained. In a similar manner, when current from source 18 flows in the first path, sections 23 and 25 only are rendered resistive, and section 24 remains superconducting. Thus, the path in which current is flowing in the flip-flop of FIG. 2 can be determined by simply measuring the resistance of the gate conductor of K17 which may be, by way of example, one arm of a Wheatstone bridge, since two units of resistance are introduced in the gate when current flows in the first path and only a single unit of resistance when current flows in the second path. Because of the small values of resistance exhibited by the operating sections at the superconductive temperature, however, it is preferred to measure the voltage drop across the gate when fed by a current, which may advantageously have a value equal to about 90% of the value of the critical current of the operating sections, from a constant current source 28. The magnitude of the current from source 28 can be increased to a value just slightly below the value of the critical current of the operating sections 23, 24 and 25, to develop maximum output voltage if needed, since the action of isolating sections 26 and 27 effectively prevents the heating of a resistive operating section from effecting other superconducting operating sections of the gate conductor. However, it should be pointed out that as the current from source 28 is increased, the $I^2R$ heating in the resistive operating sections may be sufficient of and by itself to reduce the critical current value therein below the value of current from source 28. Although this heating does not affect the state of other operating sections, as hereinbefore explained, a resistive operating section would not return to the superconducting state when current is removed from the associated control conductor. When maximum output voltage is desired therefore, current from source 28 is periodically interrupted to allow the original value of critical current of the operating sections to be obtained. Although only three operating sections and two isolating sections have been illustrated, by way of example, it is apparent that a greater number may be employed. An additional advantage of the output circuit illustrated in FIG. 2 is that a voltmeter 29, which indicates the state of the flip-flop does not have to be maintained at a superconductive temperature, rather it can be located remote from the superconductive circuit with only a single non-current carrying conductor connected therebetween.

Figure 3:
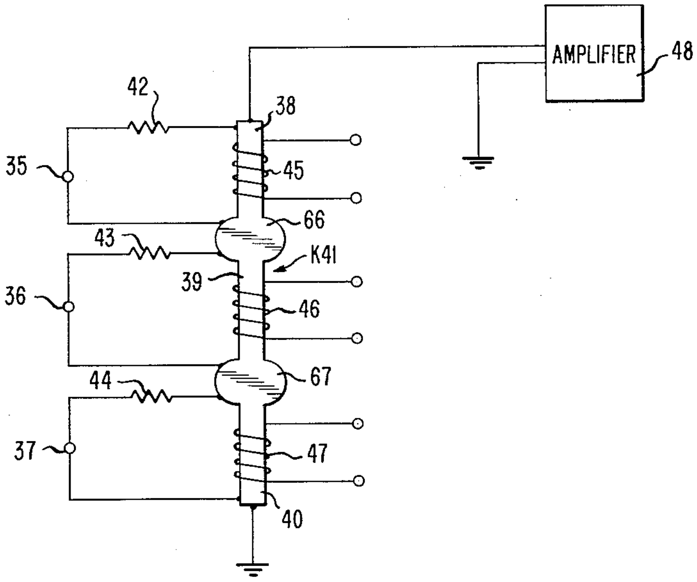
FIG. 3 is a schematic diagram of the cryotron of the invention employed in a commutator circuit.

FIG. 3 illustrates the cryotron of the invention employed in a commutator of the type described in copending application Serial No. 704,940, filed December 24, 1957, on behalf of Andrew E. Brennemann and assigned to the assignee of this application. As shown in FIG. 3, three analog sensing elements, 35, 36 and 37, generate a voltage which is a function of the condition being sensed. The output of these elements is individually applied to operating sections 38, 39 and 40, respectively, of cryotron K41, through current limiting resistors 42, 43 and 44. Current pulses applied to each of the control conductors 45, 46 and 47, successively, will destroy superconductivity in each of the associated operating sections so that a voltage proportional to the current generated by each sensing element is successively developed across the operating sections of the gate conductor of cryotron K41 and applied to an amplifier 48. Isolation sections 66 and 67 again permit selected ones of the operating sections only to become resistive in the manner previously described.

Figure 4A:
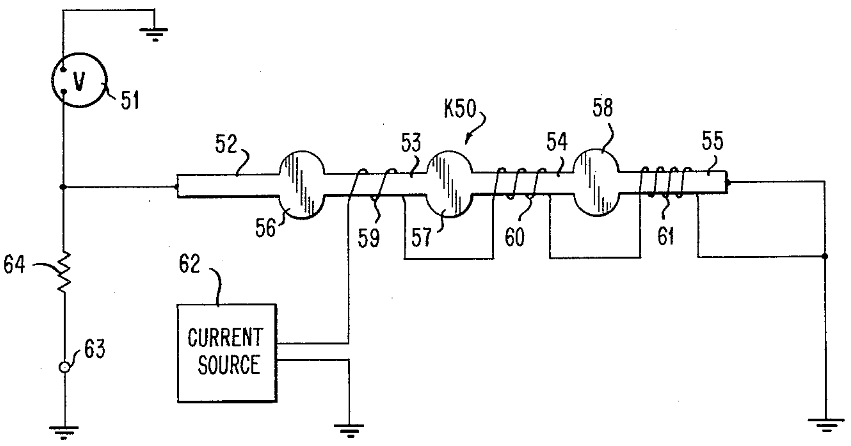
FIG. 4A is a schematic diagram of the cryotron of the invention employed in a first embodiment of a squarer.

FIG. 4A shows a modified embodiment of the cryotron of the invention which develops a voltage which is the square of the input current. That is one unit of current flowing through the gate of a cryotron K50 develops one unit of voltage as indicated by the voltmeter 51; two units of current flowing therethrough develop four units of voltage; three current units develop nine voltage units, etc. The gate conductor of K50 includes four operating sections 52, 53, 54 and 55 alternating with isolating sections 56, 57 and 58. Normally, each operating section has the same value of critical current and exhibits the same value of resistance when in the normal state. However, the critical current value of sections 53, 54 and 55 is modified by the serially connected control conductors 59, 60 and 61, when energized by current from a source 62. As indicated in FIG. 4A, control conductor 61 is effective to produce a larger value of magnetic field than either control conductor 59 or 60, and control conductor 60 is effective to produce a larger value of magnetic field than control conductor 59. This is accomplished when conventional wire-wound cryotrons are employed, by winding control 61 with a great number of turns-per-inch than controls 59 and 60, and winding control 60 with a greater number of turns-per-inch than control 59. In a similar manner, to attain the required variation in the value of magnetic field generated by the control conductors when planar cryotrons of the type disclosed in the hereinbefore referenced copending application Serial No. 625,512 are employed, controls 59, 60 and 61 are fabricated of progressively narrower material to develop a larger value of magnetic field per unit current. By a proper design of the control conductors the critical current of section 53 is one-half that of section 52, that of section 54 is one-half that of section 53, and that of section 55 is one-half that of section 54. Thus, when a current having a magnitude one-eighth the value of the critical current of section 52 (which is the value of critical current of section 55) is delivered to the gate conductor of K50 by sensing element 63 through current limiting resistor 64, section 55 only becomes resistive. Under these conditions voltmeter 51 indicates a voltage IR where I is equal to one-eighth the critical current value of section 52 and R is the normal resistance value of each of the operating sections. When the current delivered by element 63 is next doubled, sections 54 and 55 only are resistive and a voltage of $2IR+2IR$, or 4IR results, which is four times the original value. It can be seen, therefore, that as the current increases in unit increments, additional operating sections become resistive, and a voltage proportional to the square of the current increments results. Further, to prevent overheating of section 55 when section 52 is resistive, due to section 55 conducting a current eight times its critical current value, the gate conductor of cryotron K50 is preferably supported upon a metal base such as by way of example, copper. This metal base is effective to conduct excess heat away from resistive operating sections as well as stabilizing the resistance value of the resistive sections.

Figure 4B:
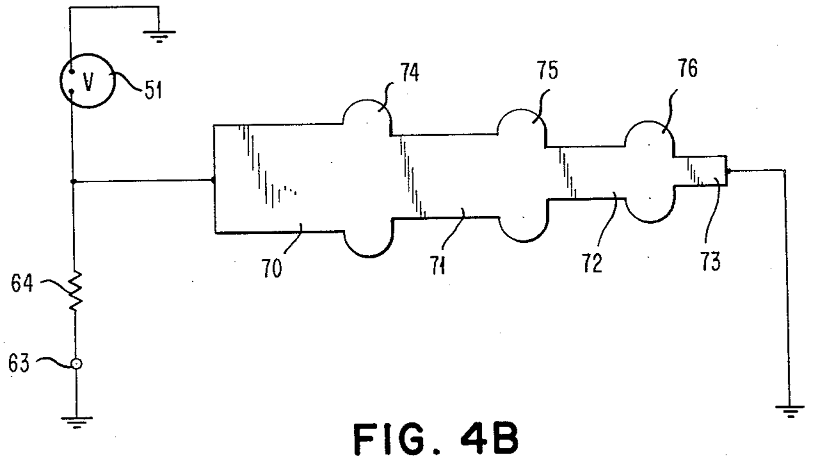
FIG. 4B is a schematic diagram of the cryotron of the invention employed in a second embodiment of a squarer.

FIG. 4B illustrates a slightly modified version of the circuit of FIG. 4A, wherein the current from element 63 itself is effective to determine the state of the operating sections. The various values of critical current required in each of the operating sections 70, 71, 72 and 73 is determined by the width of the section itself, the wider sections having a larger value of critical current, and no control conductors are required. Additionally, to maintain the required value of normal resistance, R, equal in each of the operating sections, the length of each section having a greater width is correspondingly increased. The action of the circuit of FIG. 4B is analogous to the circuit of FIG. 4A in that section 73 becomes resistive at a first value of current, secton 72 becomes resistive when the current is doubled, etc. Isolating sections 74, 75 and 76 again ensure that only the desired operating sections are resistive and the heat loss therein does not influence the state of other operating sections.

Figure 5:
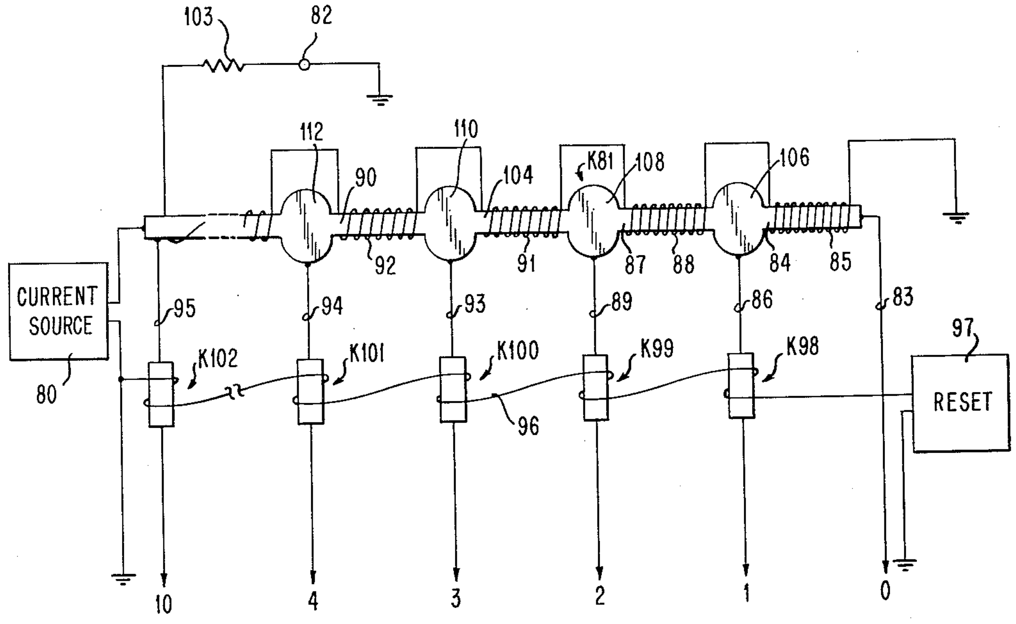
FIG. 5 is a schematic diagram of the cryotron employed as an analog to digital converter.

FIG. 5 illustrates the cryotron of the invention adapted for use in a switching network and more particularly for use as an analog to digital converter. As illustrated in FIG. 5, a cryotron K81 includes a plurality of operating sections 84, 87, 104, etc., separated by a plurality of isolating sections 106, 108, 110, etc. Again the critical current value of each operating section is modified by a plurality of serially connected control conductors 85, 88, 91, etc. As indicated in FIG. 5, control conductor 85 is effective to apply a greater value of magnetic field per unit current to an operating section than the remaining control conductors. Similarly, control conductor 88 is effective to apply a greater value of magnetic field per unit current to an operating section than each of the remaining control conductors except control 85. Continuing in a similar manner, the remaining control conductors 91, 92, etc., each progressively apply a lesser value of magnetic field per unit current to an operating section. Current from a source 80 is fed to the gate of cryotron K81, and in the absence of current from a sensing element 82, through the super-conducting gate to a line 83 which may represent, by way of example, a digital "0." When the current from element 82 attains a first predetermined value, operating section 84 is rendered resistive by current flow through control 85 to thereby effectively isolate line 83 from source 80. Current from source 80 is thereby shunted to super-conducting line 86 to indicate a digital "1," since the inductance of the operating sections is greater than the inductance of any of the output lines 86, 89, 93, etc. In a similar manner, when the current from element 82 attains a second predetermined value, operating section 87 is additionally rendered resistive by current through control 88 to thereby shunt the current from source 80 to line 89 to indicate a digital "2." Further increases of current delivered by element 82 successively render additional operating segments 104, 90, etc. resistive by current through controls 91, 92, etc., to thereby indicate corresponding digital values by means of current flow along lines 93, 94 or 95, etc. To return the current to line 83, line 96 is energized by reset device 97 to thereby render each of the digital output lines 86, 89, 93, 94, 95, etc., resistive by means of cryotrons K98, K99, K100, K101, K102, etc.

While the invention has been particularly shown and described with reference to preferred embodiments thereof, it will be understood by those skilled in the art that various changes in form and details may be made therein without departing from the spirit and scope of the invention.

What is claimed is:

1. A superconductive circuit comprising; a gate conductor and at least one control conductor; said gate conductor including a plurality of first and second sections consisting of the same superconductive material; each of said first sections having a first value of critical current; and each of said second sections having a second value of critical current greater than said first value.

2. A superconductive circuit comprising; a gate conductor consisting of a single superconductive material; said gate conductor including a plurality of operating sections and a plurality of isolating sections; each of said operating sections having a value of critical current less than the value of critical current of said isolating sections; a plurality of control conductors one for each operating section; means maintaining said circuit at a temperature at which said gate conductor is superconducting; and means to selectively energize selected ones of said control conductors whereby only selected ones of said operating sections become resistive.

3. An improved cryotron type circuit operable at a superconductive temperature comprising; a gate conductor; said gate conductor consisting of alternate first and second sections of the same superconductive material; each of said second sections being capable of maintaining superconductivity when conducting a current having a magnitude sufficient to destroy superconductivity in each of said first sections; and a plurality of control conductors one for each of said first sections and arranged in magnetic field applying relation thereto whereby superconductivity may be independently destroyed in one or more of said first sections.

4. A superconductive circuit element comprising; a plurality of alternate first and second sections consisting of the same superconducting material; each of said first sections having a first value of critical current; each of said second sections having a second value of critical current greater than said first value; a current source; means to conduct a current from said source through said element; said current having a magnitude of approximately 90% of said first current value; and means to render selected ones of said first sections resistive whereby said selected sections only are resistive.

5. A superconductive circuit element comprising; a conductor consisting of a single superconductive material having a plurality of operating sections and a plurality of isolating sections; each of said isolating sections having a value of critical current greater than the value of critical current of said operating sections; whereby when said conductor conducts a current having a value sufficient to destroy superconductivity in each of said operating sections each of said isolating sections remains superconducting.

6. The device of claim 5 wherein each of said operating sections has the same critical current value.

7. The device of claim 5 wherein each of said operating sections has a different critical current value.

8. A superconductive circuit comprising; a first current source; first and second current paths operable in parallel; means connecting said first source in series with said parallel first and second paths, each of said paths including a control conductor and a gate conductor; said control conductor in said first path effective when current from said first source flows therethrough to destroy superconductivity in said gate conductor in said second path, said control conductor in said second path effective when current from said first source flows therethrough to destroy superconductivity in said gate conductor in said first path; and means indicating in which of said paths current from said first source flows including an output gate conductor having a plurality of first and second sections of the same superconductive material, said first sections having a lower critical current value than said second sections, a plurality of control conductors one for each of said first sections, each of said plurality of control conductors effective when current from said source flows therethrough to destroy superconductivity in a corresponding one of said first sections, means connecting a portion of said plurality of control conductors in series with said first path, means connecting the remaining plurality of control conductors in series with said second path, whereby current flow in said first path renders a greater number of said first sections resistive than current flow in said second path.

9. The circuit of claim 8 including; a second current source; means connecting said second source in series with all of said plurality of first an dsecond sections of said output gate conductor; said second source effective to deliver a current having a value below the critical current value of each of said first sections; a voltage indicating device; and means connecting said device in parallel with all of said first and second sections whereby said device indicates a first value of voltage when current from said first source flows in said first path and a second value of voltage when current from said first source flows in said second path.

10. A superconductor circuit comprising; a gate conductor; said gate conductor including a plurality of first and second sections of a superconductive material; each of said first sections having a first value of critical current; each of said second sections having a second value of critical current greater than said first value; means modifying the critical current value of said first sections including a plurality of control conductors one for each of said first sections; a source of electrical current, means connecting said source and all of said control conductors electrically in series, each of said succeeding control conductors effective to apply a greater magnitude of magnetic field to a first section than each preceding control conductor when current from said source flows therethrough; and a sensing element for delivering a varying current to said gate conductor whereby increasing current from said element renders increasing ones of said first sections resistive.

11. The circuit of claim 10 wherein each succeeding control conductor reduces the value of critical current of its corresponding first section to one-half the value of the preceding first section.

12. A superconductive circuit element comprising; a conductor consisting of a predetermined superconductive material; means maintaining said element at a temperature at which said conductor is superconducting; circuit means to selectively render individual sections of said conductor resistive; and means decoupling each of said individual sections one from another including isolating sections of said same superconductive material having a width greater than said individual sections.

References Cited in the file of this patent

UNITED STATES PATENTS

| | | |
|---|---|---|
| 2,367,681 | Karplus et al. | Jan. 23, 1945 |
| 2,832,897 | Buck | Apr. 29, 1958 |
| 2,877,448 | Nyberg | Mar. 10, 1959 |
| 2,904,621 | Grier | Sept. 15, 1959 |
| 2,958,836 | McMahon | Nov. 1, 1960 |
| 2,973,441 | Courtney-Pratt | Feb. 28, 1961 |

FOREIGN PATENTS

| | | |
|---|---|---|
| 574,926 | Great Britain | Sept. 1, 1945 |